United States Patent [19]

Arakawa et al.

[11] Patent Number: 4,584,494
[45] Date of Patent: Apr. 22, 1986

[54] SEMICONDUCTOR TIMER

[75] Inventors: Hideki Arakawa; Hiromi Kawashima, both of Yokohama, Japan

[73] Assignee: Fujitsu Limited, Kawasaki, Japan

[21] Appl. No.: 566,880

[22] Filed: Dec. 29, 1983

[30] Foreign Application Priority Data

Dec. 29, 1982 [JP] Japan .............................. 57-229266

[51] Int. Cl.⁴ .................. H03K 17/296; H03K 17/687
[52] U.S. Cl. ..................................... 307/603; 307/227; 307/608; 307/228; 307/246
[58] Field of Search ............... 307/227, 228, 246, 601, 307/603, 605; 328/186

[56] References Cited

U.S. PATENT DOCUMENTS

| | | | |
|---|---|---|---|
| 3,150,271 | 9/1964 | Robertson | 307/227 |
| 3,158,757 | 11/1964 | Rywak | 328/186 |
| 3,569,842 | 3/1971 | Schroyer | 307/603 |
| 3,893,036 | 7/1975 | Cavoretto et al. | 307/227 |
| 4,503,345 | 3/1985 | Yamamura | 307/605 |

Primary Examiner—John S. Heyman
Attorney, Agent, or Firm—Staas & Halsey

[57] ABSTRACT

A semiconductor timer has a first MOS capacitor, a charge circuit for charging the first MOS capacitor, and a discharge circuit for discharging the first MOS capacitor. At least one of the charge and discharge circuits includes a transistor connected to the first MOS capacitor in series, and a second MOS capacitor connected to the gate of the transistor. The second MOS capacitor receives clock pulses and intermittently turns on the transistor in response to the clock pulses to gradually charge or discharge the first MOS capacitor.

14 Claims, 10 Drawing Figures

SEMICONDUCTOR TIMER

BACKGROUND OF THE INVENTION

1. Field of the Invention

The present invention relates to a semiconductor timer, particularly to a timer circuit formed on a metal oxide semiconductor (MOS) integrated circuit.

2. Description of the Prior Art

In certain MOS integrated circuits, it is necessary to provide a timer circuit which can set a long time interval. For example, an electrically erasable and programmable read only memory (EEPROM) in general requires timer circuits having a time interval of about 10 to 20 msec for erasing and writing operations. According to the prior art, since such a time interval is produced by a time delay of a continuously charged or discharged CR circuit, a capacitor having a relatively high capacitance, for example, about 5600 pF, is required. Such a capacitor cannot be formed from a semiconductor, so an external capacitor having a very high capacitance is attached to the integrated circuit. However, this requires the integrated citcuit to have an additional connecting pin, and adds to the manufacturing process.

Furthermore, when the EEPROM functions include automatically erasing, writing, and performing verification, timer circuits or delay circuits having a time interval of about 3 to 5 msec are required to produce each control pulse. According to the prior art, since such timer circuits or delay circuits are formed from a continuously charged or discharged CR circuit consisting of a depletion mode transistor and a MOS capacitor in the MOS integrated circuit, the sizes of the depletion mode transistor and MOS capacitor are very large. Particularly, the size of the MOS capacitor is extremely large. For example, a timer circuit having a time interval of 3 msec requires a depletion mode transistor having a size of about W/L=5 µm/500 µm and a MOS capacitor having a size of about W/L=500 µm/500 µm, where W indicates the channel width and L indicates the channel length of a MOS transistor or capacitor.

SUMMARY OF THE INVENTION

It is therefore an object of the present invention to provide a semiconductor timer which can be constructed as a MOS integrated circuit having a small size. Preferably, the semiconductor timer has a MOS capacitor of a size smaller than W/L=50 µm/50 µm, even if the time interval of the timer is about 3 msec.

The above object is achieved by a semiconductor timer comprising: a first capacitor; a charge circuit connected to the first capacitor for charging the first capacitor; and a discharge circuit connected to the first capacitor for discharging the first capacitor. At least one of the charge circuit and the discharge circuit includes a transistor connected to the first capacitor in series, and a second capacitor connected to the gate of the transistor. The second capacitor receives clock pulses and intermittently turns the transistor on in response to the clock pulses, to gradually charge or discharge the first capacitor.

According to the present invention, the charge circuit or the discharge circuit includes a transistor connected in series to a first capacitor used for charge and discharge, and a second capacitor connected to the gate of the transistor. The second capacitor receives clock pulses and intermittently turns the transistor on in response to those clock pulses, to gradually charge or discharge the first capacitor, and a long time interval can be set without increasing the size of the first capacitor. For example, a timer having a time interval of about 3 msec can be constructed with a first MOS capacitor having a size smaller than W/L=50 µm/50 µm.

A semiconductor timer according to the present invention is useful to provide the erasing time period and writing time period of an EEPROM, or to provide a time interval of several msec for another job, especially in a computer system.

BRIEF DESCRIPTION OF THE DRAWINGS

FIG. 1b is an equivalent circuit diagram of the diagram in FIG. 1a;

DESCRIPTION OF THE PREFERRED EMBODIMENTS

Figure 1A:
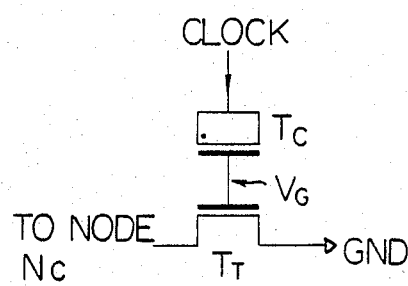
FIG. 1a is a circuit diagram of a discharge circuit used in the present invention.

FIG. 1a illustrates an example of a discharge circuit in a semiconductor timer according to the present invention. In FIG. 1a, reference symbol $T_T$ denotes an enhancement mode transistor. The drain of the transistor $T_T$ is connected to a node $N_C$ to which a first MOS capacitor (not shown) is connected. The source of the transistor $T_T$ is grounded, and the gate of the transistor $T_T$ is connected to one terminal of a second MOS capacitor $T_C$. The other terminal of the capacitor $T_C$ is connected to a clock generator (not shown) to receive clock pulses clock from the clock generator. In response to the clock pulses clock, the second MOS capacitor $T_C$ applies a voltage $V_G$, which is higher than the threshold voltage $V_{th}$ of the enhancement mode transistor $T_T$, to the gate of the enhancement mode transistor $T_T$. Thus, the transistor $T_T$ is intermittently turned on to gradually discharge the first MOS capacitor.

Figure 1B:
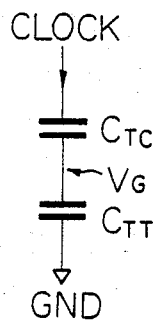
Figure 1C:
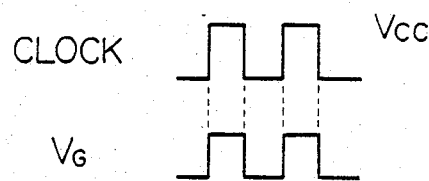
FIG. 1c is a wave-form diagram illustrating a relationship between clock pulses and gate voltage.

FIG. 1b illustrates an equivalent circuit of the discharge circuit illustrated in FIG. 1a. Equivalent capacitors $C_{TC}$ and $C_{TT}$ correspond to the second MOS capacitor $T_C$ and the transistor $T_T$, respectively. A relationship between the clock pulses clock and the voltage $V_G$, at the gate of the enhancement mode transistor $T_T$ is illustrated in FIG. 1c. The capacitance $C_{TC}$ and $C_{TT}$ of the equivalent capacitors $C_{TC}$ and $C_{TT}$ shown in FIG. 1b are defined as $$C_{TC} = \epsilon_{OX} \cdot \epsilon_0 \cdot L_{TC} \cdot W_{TC} / t_{OX} \qquad (1)$$

$$C_{TT} = \epsilon_{OX} \cdot \epsilon_O \cdot L_{TT} \cdot W_{TT} / t_{OX} \qquad (2)$$

where $\epsilon_{OX}$ is the relative permittivity of the gate oxide layer, $\epsilon_O$ is the permittivity of free space, $t_{OX}$ is the thickness of the gate oxide layer, $L_{TC}$ and $L_{TT}$ are the channel length of the transistor constituting the MOS capacitor $T_C$ and of the enhancement mode transistor $T_T$, and $W_{TC}$ and $W_{TT}$ are the channel width of the above transistors. The voltage $V_G$ at the gate of the enhancement mode transistor $T_T$ when the clock pulses clock have the voltage $V_{CC}$ is defined as $$V_G = \frac{C_{TC}}{C_{TC} + C_{TT}} \cdot V_{CC} \qquad (3)$$

Therefore, the voltage $V_G$ at the gate of the transistor $T_T$ when the clock pulses clock have the voltage $V_{CC}$ can be easily selected to be a voltage higher than the threshold voltage $V_{th}$ of the enhancement mode transistor $T_T$, by designing the channel length $L_{TC}$ and the channel width $W_{TC}$ of the MOS capacitor $T_C$ to appropriate values.

The enhancement mode transistor $T_T$ will be turned on only when the clock pulses clock have the voltage $V_{CC}$, causing the charge in the first MOS capacitor to discharge very slowly. As a result, the size of the first MOS capacitor can be reduced.

Figure 2:
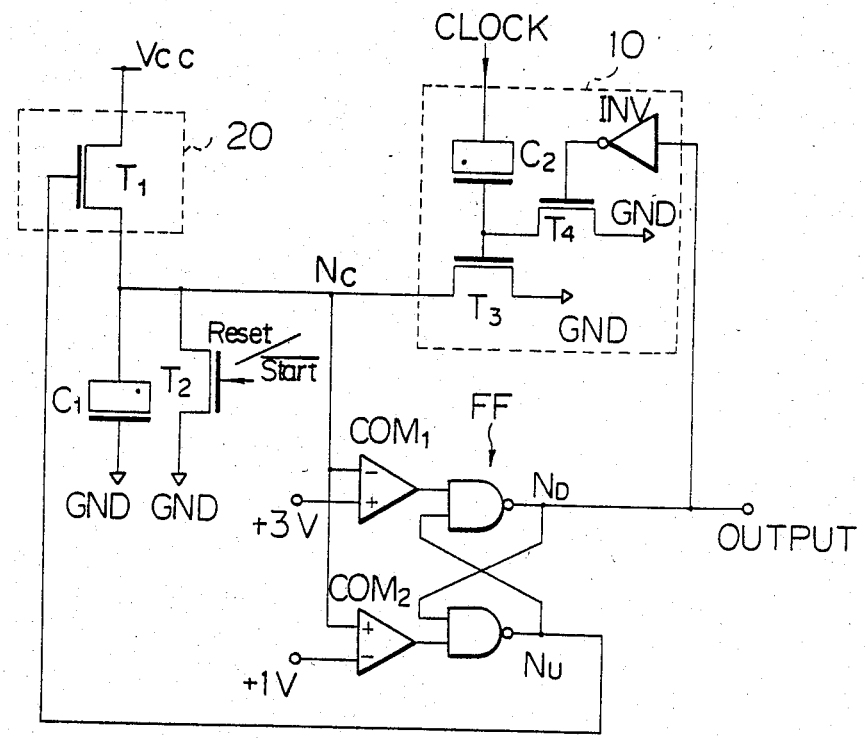
FIG. 2 is a circuit diagram of an embodiment of the present invention.

FIG. 2 illustrates an embodiment of the present invention, in which the discharge circuit illustrated in FIG. 1a is used. In FIG. 2, reference numeral 10 indicates a discharge circuit, and 20 indicates a charge circuit. The discharge and charge circuits 10 and 20 are connected to one terminal (node $N_C$) of a first MOS capacitor $C_1$. The other terminal of the first MOS capacitor $C_1$ is grounded. One terminal of each of the first and second comparators COM1 and COM2 is connected to node $N_C$ of the first MOS capacitor $C_1$. The first comparator COM1 compares the voltage $V_{NC}$ at the node $N_C$ with a constant reference voltage of 3 V, and the second comparator COM2 compares the voltage $V_{NC}$ with a constant reference voltage of 1 V. The output terminals of the first and second comparators COM1 and COM2 are connected to input terminals of a flip-flop FF of a negative edge trigger type. One output terminal (node $N_D$) of the flip-flop FF is connected to the discharge circuit 10, and the other output terminal (node $N_U$) is connected to the charge circuit 20. The output of this timer is obtained from the node $N_D$. It is apparent that the output of the timer may also be obtained from the node $N_U$. A transistor $T_2$ for resetting and starting the timer is connected in parallel with the first MOS capacitor $C_1$.

The discharge circuit 10 comprises a second MOS capacitor $C_2$ which corresponds to the second MOS capacitor $T_C$ in FIG. 1a, an enhancement mode transistor $T_3$ which corresponds to the transistor $T_T$ in FIG. 1a, a transistor $T_4$ connected between the gate of the transistor $T_3$ and ground, and an inverter INV connected between the gate of the transistor $T_4$ and the node $N_D$.

The charge circuit 20 comprises a transistor $T_1$ connected between a voltage supply (not shown), for supplying the power supply voltage $V_{CC}$, and the node $N_C$. The gate of the transistor $T_1$ is connected to the node $N_U$.

Figure 3:
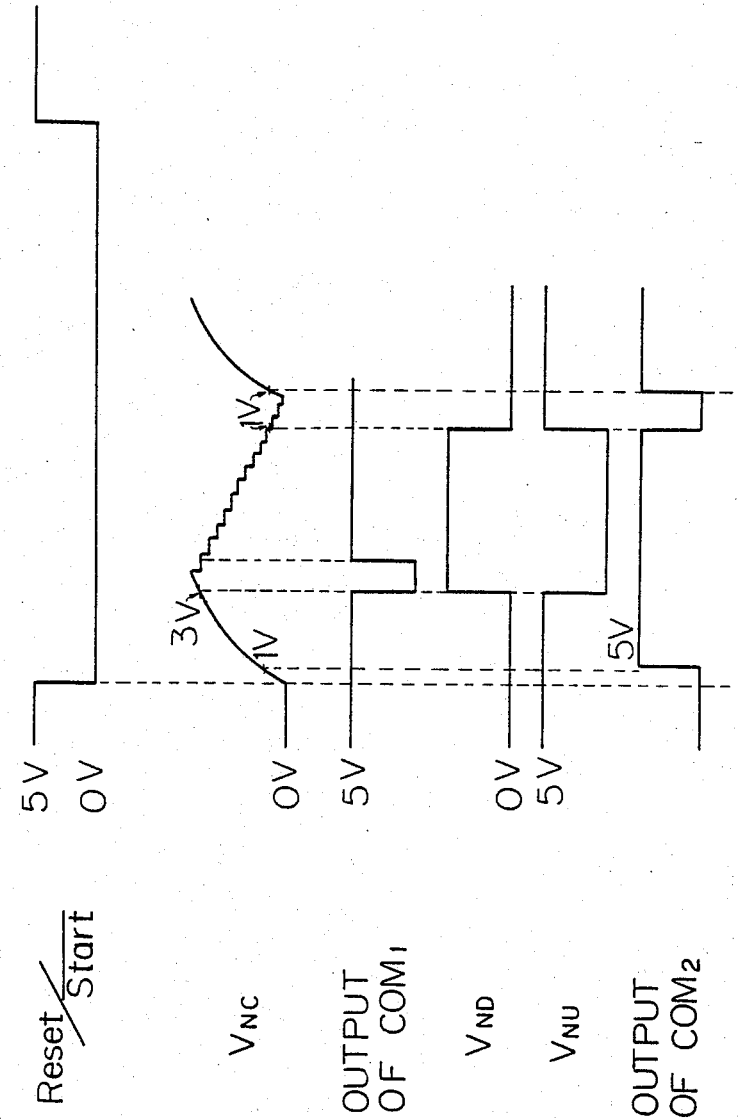
FIG. 3 is a wave-form diagram illustrating an operation of the embodiment of FIG. 2.

FIG. 3 illustrates wave-forms at various points in the embodiment of FIG. 2. Hereinafter, the operation of the embodiment of FIG. 2 will be described with reference to FIG. 3. During a reset condition, since the transistor $T_2$ is in an on state, the voltage $V_{NC}$ at the node $N_C$, which is equivalent to the voltage across the first MOS capacitor $C_1$, is zero (0 V). Therefore, the output of the first comparator COM1 is the "H" level (5 V) and the output of the flip-flop FF, namely the voltage $V_{NU}$ at the node $N_U$, is also the "H" level (5 V). As a result, the transistor $T_1$ is in the on state. Furthermore, since the voltage $V_{ND}$ at the node $N_D$ is the "L" level (0 V), the transistor $T_4$ is in the on state and, thus, the transistor $T_3$ is maintained in the off state during the reset condition.

From the above reset condition, if a reset/start signal Reset/Start changes to the "L" level (0 V) and thus the transistor $T_2$ is turned off, the charging operation of the first MOS capacitor $C_1$ starts. Namely, current is supplied to the first MOS capacitor $C_1$ via the transistor $T_1$. Thus, the voltage $V_{NC}$ at the node $N_C$ increases, as illustrated in FIG. 3. When the voltage $V_{NC}$ exceeds 3 V, the output of the first comparator COM1 changes from "H" level to "L" level, causing the outputs $V_{ND}$ and $V_{NU}$ of the flip-flop FF to change from "L" level to "H" level and from "H" level to "L" level, respectively, as illustrated in FIG. 3. As a result, the transistor $T_1$ is turned off and the transistor $T_4$ is turned off, causing the discharging operation of the first MOS capacitor $C_1$ to start. In other words, since the transistor $T_1$ is turned off, the charging operation of the first MOS capacitor $C_1$ will stop. Meanwhile, since the transistor $T_4$ is off, the voltage $V_G$ at the gate of the transistor $T_3$ momentarily increases each time a clock pulse having a predetermined frequency is applied to the second MOS capacitor $C_2$, causing the transistor $T_3$ to intermittently turn on in response to the clock pulses clock. Therefore, the first MOS capacitor $C_1$ is gradually discharged.

When the voltage $V_{NC}$ decreases to a level below 1 V, the output of the second comparator COM2 changes from "H" level to "L" level, causing the outputs $V_{ND}$ and $V_{NU}$ of the flip-flop FF to change from "H" level to "L" level and from "L" level to "H" level, respectively. As a result, the transistor $T_1$ is turned on to start the charging operation with respect to the first MOS capacitor $C_1$, and the transistor $T_4$ is turned on to ground the gate of the transistor $T_3$, causing the transistor $T_3$ to be maintained in an off state.

According to the above embodiment, the voltage $V_{NC}$ across the first MOS capacitor $C_1$ gradually changes between +3 V and +1 V. Thus, a long time interval of 3 msec can be obtained for the charging and discharging operations by using a first capacitor $C_1$ having a small size of about W/L=50 μm/50 μm.

Figure 4:
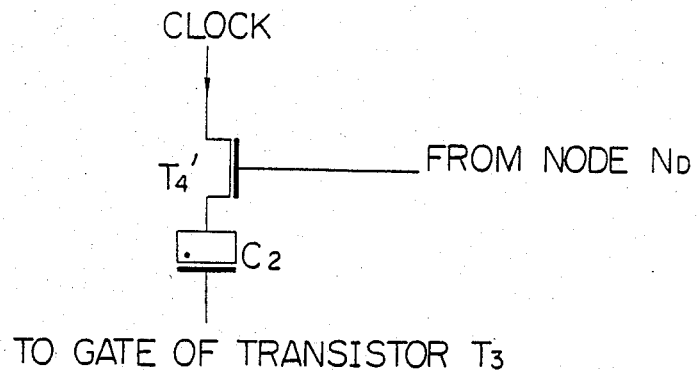
FIG. 4 is a circuit diagram of a part of a discharge circuit used in another embodiment of the present invention.

FIG. 4 illustrates a part of another example of the discharge circuit 10 in FIG. 2. In this example, a transistor $T_4'$ is inserted between the second MOS capacitor $C_2$ and the clock generator (not shown), instead of the transistor $T_4$ and the inverter INV in the circuit illustrated in FIG. 2. During a reset condition and charging operation, the transistor $T_4'$ is off, and the clock pulses clock are not applied to the second MOS capacitor $C_2$, causing the transistor $T_3$ (FIG. 2) to be maintained in an off state.

Figure 5:
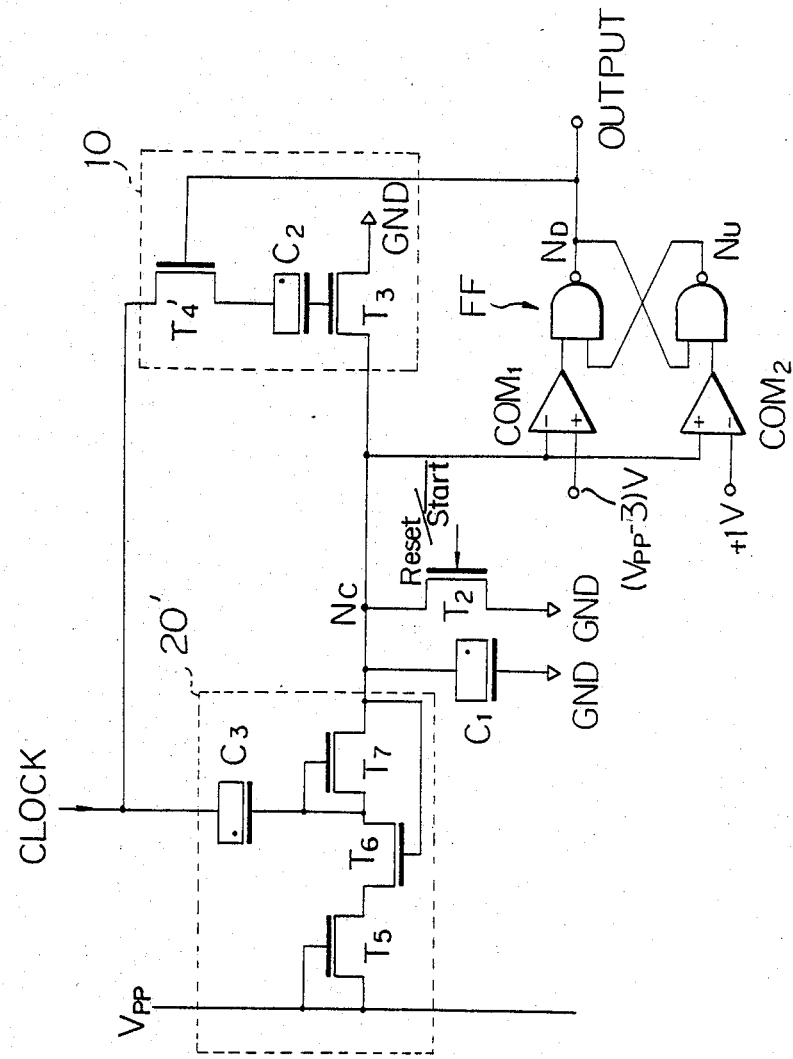
FIG. 5 is a circuit diagram of another embodiment of the present invention.

FIG. 5 illustrates another embodiment of the present invention, in which the discharge circuit 10 in FIG. 4 is used, and a charge circuit 20' different from that illustrated in the embodiment of FIG. 2, is used. Furthermore, in this embodiment, a high voltage $V_{pp}$ is used for charging the first MOS capacitor $C_1$.

The charge circuit 20' includes a charge pump circuit which comprises a third MOS capacitor $C_3$ and transistors $T_5$, $T_6$ and $T_7$. The gate and drain of the transistor $T_7$ and the source of the transistor $T_6$ are connected to one terminal of the third MOS capacitor $C_3$. The other terminal of the third MOS capacitor $C_3$ is connected to the clock generator (not shown) to receive the clock pulses clock. The source of the transistor $T_7$ and the gate of the transistor $T_6$ are connected to the node $N_C$. The drain of the transistor $T_6$ is connected to the source of the transistor $T_5$, and the gate and drain of the transistor $T_5$ are connected to a line for supplying a high voltage $V_{PP}$ of about 19 V. The first comparator $COM_1$ receives a constant reference voltage $(V_{PP}-3)$ V which is about 16 V. The remainder of this embodiment is the same as that of the embodiment illustrated in FIG. 2.

Figure 6:
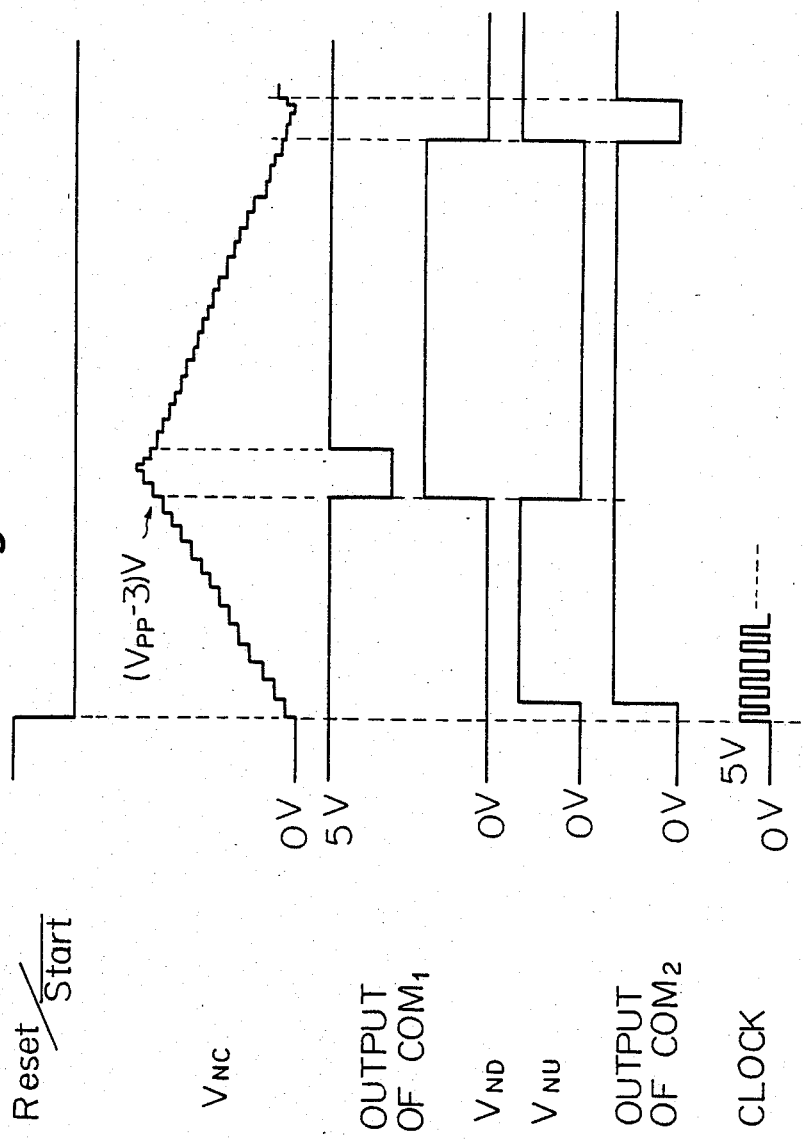
FIG. 6 is a wave-form diagram illustrating an operation of the embodiment of FIG. 5.

FIG. 6 illustrates waveforms at various points in the embodiment in FIG. 5. Hereinafter, the operation of the embodiment in FIG. 5 will be explained with reference to FIG. 6. In response to the clock pulses clock, the voltage at the gate of the transistor $T_7$ momentarily increases and thus the transistor $T_7$ is intermittently turned on, causing a small charge from the line supplying the high voltage $V_{PP}$ to be pumped into the first MOS capacitor $C_1$. Therefore, the first MOS capacitor $C_1$ is gradually charged, as illustrated in FIG. 6. For example, the first MOS capacitor $C_1$ is charged by $\Delta Q_1$ in response to the clock pulse. When the voltage $V_{NC}$ exceeds $(V_{PP}-3)$ V, which may be equal to 16 V, the output of the first comparator $COM_1$ changes from "H" level to "L" level, causing the output $V_{ND}$ of the flip-flop FF or bistable device to change from "L" level to "H" level, as illustrated in FIG. 6. As a result, the transistor $T_4'$ is turned on, causing a discharging operation of the first MOS capacitor $C_1$ to start. The first MOS capacitor $C_1$ is discharged by $\Delta Q_2$ in response to the clock pulse by the discharge circuit 10 while it is being charged by $\Delta Q_1$ in response to the clock pulse by the charge circuit 20'. The circuit is designed so that $\Delta Q_2 > \Delta Q_1$ and the first MOS capacitor $C_1$ is therefore discharged by $\Delta Q_2 - \Delta Q_1$ in response to the clock pulse. The remainder of this embodiment's operation is the same as that of the embodiment illustrated in FIG. 2.

According to the above embodiment, since the charge voltage is high (19 V), a MOS capacitor having a smaller capacitance than that in FIG. 2 can be used for forming the timer having the same time interval. Furthermore, since not only the discharging operation but also the charging operation are executed very slowly, by intermittently turning on the transistor to $T_7$ to transmit charge, a timer having a longer time interval than that in FIG. 2 can be formed.

Figure 7:
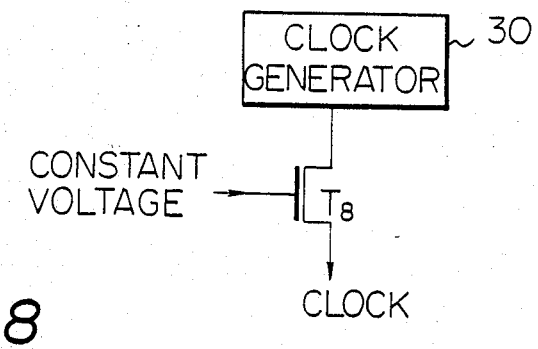
FIG. 7 is a circuit diagram of a circuit for stabilizing the amplitude of the clock pulses.

In the above mentioned embodiments, however, if the supply voltage $V_{CC}$ varies, the amplitude of the clock pulses clock will change, causing the time interval of the timer to change. FIG. 7 illustrates an example of a circuit for preventing the above problem from occurring. In this example, a transistor $T_8$ is inserted between a clock generator 30 and the charge and/or discharge circuits, and a constant voltage of, for example, 4 V, is supplied to the gate of the transistor $T_8$. Therefore, the amplitude of the clock pulses clock is always maintained at a voltage of $(4-V_{th})$ V irrespective of any change in $V_{CC}$, where $V_{th}$ is a threshold voltage of the transistor $T_8$.

Figure 8:
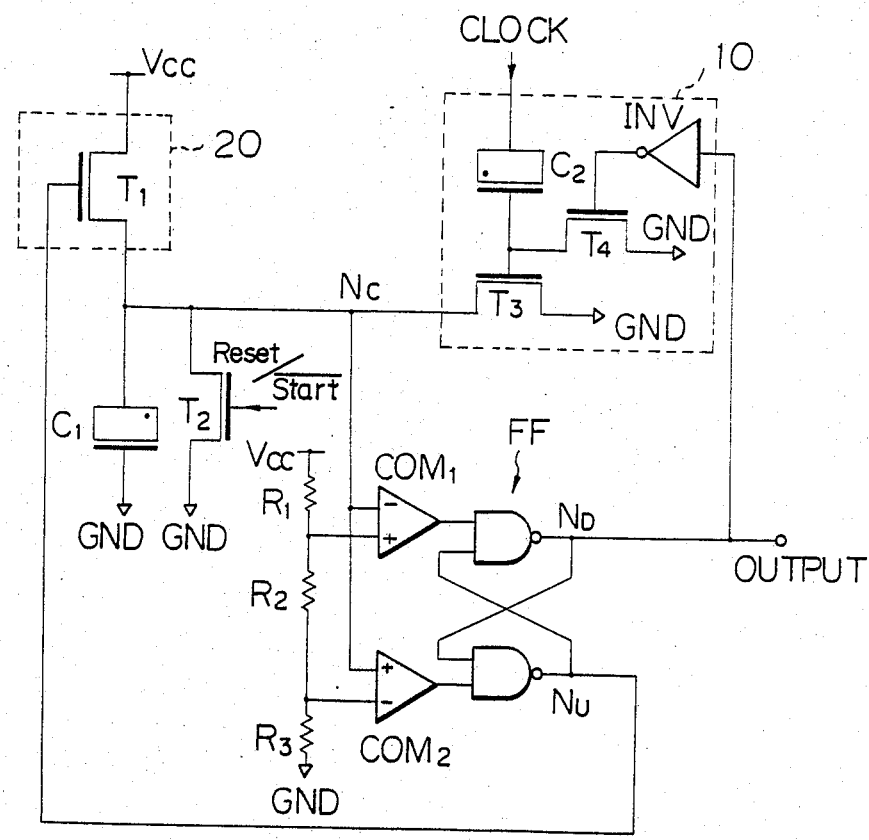
FIG. 8 is a circuit diagram of a further embodiment of the present invention.

FIG. 8 illustrates a further embodiment of the present invention. This embodiment also prevents the above-mentioned problem from occurring. In this embodiment, variable reference voltages are applied to the first and second comparators $COM_1$ and $COM_2$. The variable reference voltges are produced by dividing the power supply voltage $V_{CC}$ by means of resistors $R_1$, $R_2$ and $R_3$ connected in series with each other. Therefore, the voltage $V_{NC}$ for switching between the charging and discharging operations changes depending upon the power supply voltage $V_{CC}$, causing the change in time periods of the charging operation and the discharging operation due to changes in the level of $V_{CC}$ to be reduced. The remainder of the construction and operation of the embodiment of FIG. 8 is the same as those of the embodiment of FIG. 2.

Many widely different embodiments of the present invention may be constructed without departing from the spirit and scope of the present invention. It should be understood that the present invention is not limited to the specific embodiments described in this specification, except as defined in the appended claims.

We claim:

1. A semiconductor timer operatively connectable to receive clock pulses, comprising:

a first capacitor;

a charge circuit, operatively connected to said first capacitor, for performing a charging operation on said first capacitor;

a discharge circuit, operatively connected to said first capacitor, for performing a discharging operation on said first capacitor;

monitoring means, operatively connected to said first capacitor and said discharge circuit, for monitoring a voltage across said first capacitor and producing an electrical signal used for starting one of the charging operation of said charge circuit and the discharging operation of said discharge circuit; and clock pulse enabling means, operatively connected to said monitoring means and at least one of said charge and discharge circuits, for enabling and preventing passage of the clock pulses in dependence upon the electrical signal;

at least one of said charge circuit and said discharge circuit comprising:

a first transistor, operatively connected in series with said first capacitor, having a gate; and a second capacitor, operatively connected to the gate of said first transistor and said clock pulse enabling means, intermittently turning on said first transistor in response to the clock pulses for performing one of the charging and discharging operations on said first capacitor.

2. A semiconductor timer as claimed in claim 1, wherein said monitoring means produces a first electrical signal used for starting the discharging operation of said discharge circuit and a second electrical signal used for starting the charging operation of said charge circuit.

3. A semiconductor timer as claimed in claim 2, wherein said semiconductor timer is operatively connectable to receive upper and lower limit voltages and said monitoring means comprises comparing means, operatively connected to said first capacitor, said charge circuit, said discharge circuit and connectable to receive the upper and lower limit voltages, for comparing whether the voltage across said first capacitor is higher than the upper limit voltage and whether the voltage across said first capacitor is lower than the lower limit voltage.

4. A semiconductor timer as claimed in claim 3, wherein said comparing means comprises:
    first comparator means, operatively connected to said first capacitor and connectable to receive the upper limit voltage, for comparing the voltage across said first capacitor with the upper limit voltage and producing an output;
    second comparator means, operatively connected to said first capacitor and connectable to receive the lower limit voltage, for comparing the voltage across said first capacitor with the lower limit voltage and producing an output; and
    bistable means, operatively connected to said first and second comparator means and said charge and discharge circuits, for producing the first and second electrical signals in response to the outputs from said first and second comparator means, respectively.

5. A semiconductor timer as claimed in claim 3, wherein the upper and lower limit voltages are constant voltages.

6. A semiconductor timer as claimed in claim 5, wherein said semiconductor timer is operatively connectable to receive a power supply voltage and the upper and lower limit voltages vary in dependence upon the power supply voltage.

7. A semiconductor timer as claimed in claim 3, wherein said discharge circuit comprises:
    said first transistor, operatively connected in series with said first capacitor; and
    said second capacitor, operatively connected to the gate of said first transistor and connectable to receive the clock pulses, intermittently turning on said first transistor in response to the clock pulses to gradually discharge said first capacitor, and
    wherein said clock pulse enabling means comprises a second transistor, operatively connected between the gate of said first transistor and ground, having a gate operatively connected to said monitoring means to receive the first electrical signal.

8. A semiconductor timer as claimed in claim 7, operatively connectable to receive a power supply voltage, wherein said charge circuit comprises a third transistor, operatively connected to said first capacitor and connectable to receive the power supply voltage, having a gate operatively connected to said monitoring means to receive the second electrical signal and applying the power supply voltage to said first capacitor.

9. A semiconductor timer as claimed in claim 3, wherein said discharge circuit comprises:
    said first transistor operatively connected in series with said first capacitor; and
    said second capacitor operatively connected to the gate of said first transistor, and
    wherein said clock pulse enabling means comprises a second transistor, operatively connected to said second capacitor and to receive the clock pulses, having a gate operatively connected to said monitoring means to receive the first electrical signal and supplying the clock pulses to said second capacitor to turn on said first transistor in response to the clock pulses, thereby gradually discharging said first capacitor.

10. A semiconductor timer as claimed in claim 9, operatively connectable to receive a power supply voltage, wherein said charge circuit comprises a third transistor, operatively connected to said first capacitor, having a gate operatively connected to said monitoring means to receive the second electrical signal and applying the power supply voltage to said first capacitor in dependence upon the second electrical signal.

11. A semiconductor timer as claimed in claim 1, wherein said discharge circuit comprises:
    said first transistor operatively connected in series with said first capacitor; and
    said second capacitor, operatively connected to the gate of said first transistor and connectable to receive the clock pulses, intermittently turning on said first transistor in response to the clock pulses to gradually discharge said first capacitor, and
    wherein said clock pulse enabling means comprises a second transistor, operatively connected between the gate of said first transistor and ground, having a gate operatively connected to said monitoring means to receive the electrical signal.

12. A semiconductor timer as claimed in claim 11, wherein said charge circuit comprises:
    a third transistor operatively connected in series with said first capacitor and having a gate; and
    a third capacitor, operatively connected to the gate of said third transistor and connectable to receive the clock pulses, intermittently turning on said third transistor in response to the clock pulses to gradually charge said first capacitor.

13. A semiconductor timer as claimed in claim 1, wherein said discharge circuit comprises:
    said first transistor operatively connected in series to said first capacitor; and
    said second capacitor operatively connected to the gate of said first transistor, and
    wherein said clock pulse enabling means comprises a second transistor, operatively connected to said second capacitor and to receive the clock pulses, having a gate operatively connected to said monitoring means to receive the electrical signal and supplying the clock pulses to said second capacitor to turn on said first transistor in response to the clock pulses, thereby gradually discharging said first capacitor.

14. A semiconductor timer as claimed in claim 13, wherein said charge circuit comprises:
    a third transistor operatively connected in series with said first capacitor, and having a gate; and
    a third capacitor, operatively connected to the gate of said third transistor and connectable to receive the clock pulses, intermittently turning on said third transistor in response to the clock pulses to gradually charge said first capacitor.

* * * * *